(12) United States Patent
Ikeda

(10) Patent No.: US 7,235,949 B2
(45) Date of Patent: Jun. 26, 2007

(54) BATTERY CAPACITY DETECTION APPARATUS AND DETECTION METHOD

(75) Inventor: Makoto Ikeda, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/873,030

(22) Filed: Jun. 21, 2004

(65) Prior Publication Data
US 2005/0024018 A1    Feb. 3, 2005

(30) Foreign Application Priority Data
Jun. 20, 2003   (JP)   ............... 2003-176403

(51) Int. Cl.
*H02J 7/00* (2006.01)
(52) U.S. Cl. .................................................. 320/132
(58) Field of Classification Search ................ 320/132, 320/127, 134
See application file for complete search history.

(56) References Cited

U.S. PATENT DOCUMENTS

| | | | |
|---|---|---|---|
| 4,219,999 A | 9/1980 | Ichikawa et al. | 368/66 |
| 5,136,246 A * | 8/1992 | Sakamoto | 324/433 |
| 5,640,081 A * | 6/1997 | Austin et al. | 320/127 |
| 2002/0060553 A1 | 5/2002 | Kato | 324/433 |

FOREIGN PATENT DOCUMENTS

| | | |
|---|---|---|
| JP | 07-325134 | 12/1995 |
| JP | 2002-228731 | 8/2002 |
| JP | 2003-031268 | 1/2003 |

OTHER PUBLICATIONS 3-page EPO Form 1507.0 European Search Report which issued in application No. EP 04 01 3630 citing the above 2 references.

* cited by examiner

*Primary Examiner*—Karl Easthom
*Assistant Examiner*—Samuel Berhanu
(74) *Attorney, Agent, or Firm*—Anderson Kill & Olick, PC (57) ABSTRACT

A detection device and method for accurately detecting the battery capacity remaining in the device independent of the operating mode of the device. When the battery-powered device is operating in a low load mode, the battery discharge voltage is A/D converted and the remaining battery capacity is determined based on the resulting digital signal. When the battery-powered device is operating in a high load mode, the battery discharge voltage is compared with specific threshold voltages, and an interrupt process is run based on the comparison result to calculate the remaining battery capacity.

9 Claims, 5 Drawing Sheets

BATTERY CAPACITY DETECTION APPARATUS AND DETECTION METHOD

BACKGROUND OF THE INVENTION

1. Field of Technology

The present invention relates generally to an apparatus for detecting the residual energy of a battery installed in a device, and more particularly for detecting the residual energy of a battery installed in a mobile device in which the battery output differs depending upon the operating mode of the device. Such mobile devices include compact printers and digital cameras.

2. Description of Related Art

Various devices for detecting the residual energy ("remaining capacity") of a battery installed in a mobile device are known from the literature. The device taught in Japanese Unexamined Patent Appl. Pub. H7-325134, for example, has a first voltage detector for detecting a discharge voltage greater than a threshold voltage, and a second voltage detector for detecting the threshold voltage, based on a threshold voltage determined according to the maximum discharge voltage of the battery. To detect the battery capacity, both the first and second voltage detectors detect the discharge voltage in respective detection ranges, and determine whether the detected discharge voltage is greater than the threshold voltage based on first and second digital values acquired from the detected discharge voltages. Based on the result of this comparison, either the first or second digital value is selected, and the residual battery capacity is determined based on the selected digital values.

This detection device improves the resolution of the analog/digital conversion circuit by using two different voltage detectors to detect the discharge voltage, and thereby improves the discharge voltage detection precision.

This detection device converts the detected discharge voltages of the battery to digital signals using an A/D converter, regularly samples the digital signals using the MPU in the device, and calculates the battery capacity based on predetermined rules.

In mobile devices such as compact printers, however, the battery load differs greatly between the printer mechanism when operating in a (high load mode) as compared to when the printer mechanism is in a standby state (low load mode). While the discharge voltage of the battery varies greatly with this change in the load, a heavy load is also applied to the MPU of the device when the printer mechanism is in the operating mode. It is therefore difficult to use the MPU to sample the battery discharge voltage. If the sampling interval is increased in order to reduce the load on the MPU, detection precision drops, and voltage detection may not be possible at the maximum discharge load.

Because the discharge voltage fluctuates greatly in the high load mode, there is a limit to the detection precision that can be achieved by sampling the A/D-converted digital discharge voltage signal at a constant period and processing the sampled values by the MPU.

Furthermore, when a compact mobile printer is monitored by a host device, communication is required between the printer and host at a regular timing. This means that the MPU must also have sufficient reserve capacity to handle communications. Because the operating mode of the compact printer is unrelated to the communication timing, the MPU must also have sufficient capacity to enable smooth communication even when the printer is in the high load mode.

SUMMARY OF THE INVENTION

An object of the present invention is to provide a detection apparatus and detection method for always accurately detecting the remaining battery capacity regardless of the operating mode of the device.

Another object of the invention is to provide a detection apparatus and detection method for minimizing the load on a device which includes a microprocessor "MPU" even when the device is in the high load mode so that the MPU can be used to execute operations for detecting the remaining battery capacity.

The discharge voltage of a battery also varies with changes in temperature. Detection errors can therefore result from detecting the battery capacity based only on the discharge voltage. A further object of the present invention is therefore to provide a detection apparatus and a detection method for always accurately detecting the remaining battery capacity regardless of change in the battery temperature.

One embodiment of the present invention is directed to an apparatus for detecting the remaining capacity of a battery installed in a device including an operating mode detection device for determining if the device is operating in a low load mode or a high load mode; an A/D converter for A/D converting battery output; a comparator for comparing battery output with a specific reference output; and an MPU for calculating the remaining capacity of the battery based on a digital output from the A/D converter when the operating mode of the device is the low load mode, and to use the MPU to execute an interrupt process to calculate remaining battery capacity based on comparator output when the operating mode of the device is the high load mode.

The detection apparatus A/D converts the battery output, that is, the battery discharge voltage, and applies the digital output to an MPU to calculate the remaining battery capacity when the device is operating in the low load mode. Because the load on the MPU is low when in the low load mode, the A/D converter output may be sampled at a short interval, and the remaining battery capacity can be accurately determined.

When the device is operating in the high load mode, however, the analog battery discharge voltage is compared with a specific reference voltage (threshold voltage), and the MPU executes an interrupt process based on the comparison result. Because the MPU executes an operation to determine the remaining battery capacity only when the device is operating in the high load mode the load on the MPU resulting from this detection can be minimized.

The present invention is particularly useful when applied to battery powered devices that are also compact and mobile. Such devices have at least two operating modes, a low load mode and a high load mode. When in the high load mode, the load on the MPU is high. Examples of such devices include mobile POS printers and digital cameras. The type of battery used with such devices is not particularly limited, and lithium batteries or other common types of batteries could be used.

The method of determining whether the device is operating in the low load mode or high load mode can be appropriately selected according to the characteristics of the device, but the operating mode is preferably determined based on the size of the load on the MPU that controls device operation. By assuring that the MPU always has spare capacity, stable device operation and high precision battery capacity detection can be assured. If the low load mode is when the load on the MPU is small, the MPU can calculate the remaining battery capacity by running a software program in the low load mode. On the other hand, the high load mode is when the load on the MPU is high, the remaining battery capacity is therefore checked by hardware, and the load on the MPU is reduced.

Battery capacity can be determined using a hardware operation in all operating modes, but this is not practical because numerous comparators are needed for accurate battery capacity detection, and manufacturing cost would thus rise.

The load on the MPU can be uniformly determined from the operating status of the device (the operating mode). For example, if the device is a compact printer for mobile use, the load on the MPU is low (called the low load mode) when the device is in the standby state (including during communication with the host), and the load on the MPU is high (called the high load mode) during paper feed, print head heating, printing, and paper cutter operations. It is therefore possible to determine whether the device is in the low load mode or in the high load mode from the state of switches on the printer.

Furthermore, because motors and/or heaters operate during paper feed, print head heating, printing, and paper cutter operations, the high load mode can be defined as when the motor and/or heater is operating, and the low load mode as the mode when they are not operating. The operating mode can thus be determined from the on/off state of mechanical and thermal operating elements.

The discharge voltage of a battery varies according to temperature of the battery, and even if the battery capacity is determined to be low from the discharge voltage under high temperature conditions, there might be sufficient charge left under low temperature conditions. To prevent such detection errors, another aspect of the present invention also measures and uses battery temperature to determine battery capacity. The measured battery temperature is referenced to calculate the remaining battery capacity.

In order to reflect the battery temperature on the remaining battery capacity determination, battery temperature, battery discharge voltage, and remaining battery capacity level data are compiled in data tables for each operating mode, and referenced. The discharge voltage of the battery can also be corrected based on the battery temperature.

Other objects and attainments together with a fuller understanding of the invention will become apparent and appreciated by referring to the following description and claims taken in conjunction with the accompanying drawings.

DESCRIPTION OF THE PREFERRED EMBODIMENTS

A preferred embodiment of the present invention is described below with reference to the accompanying figures.

Figure 1:
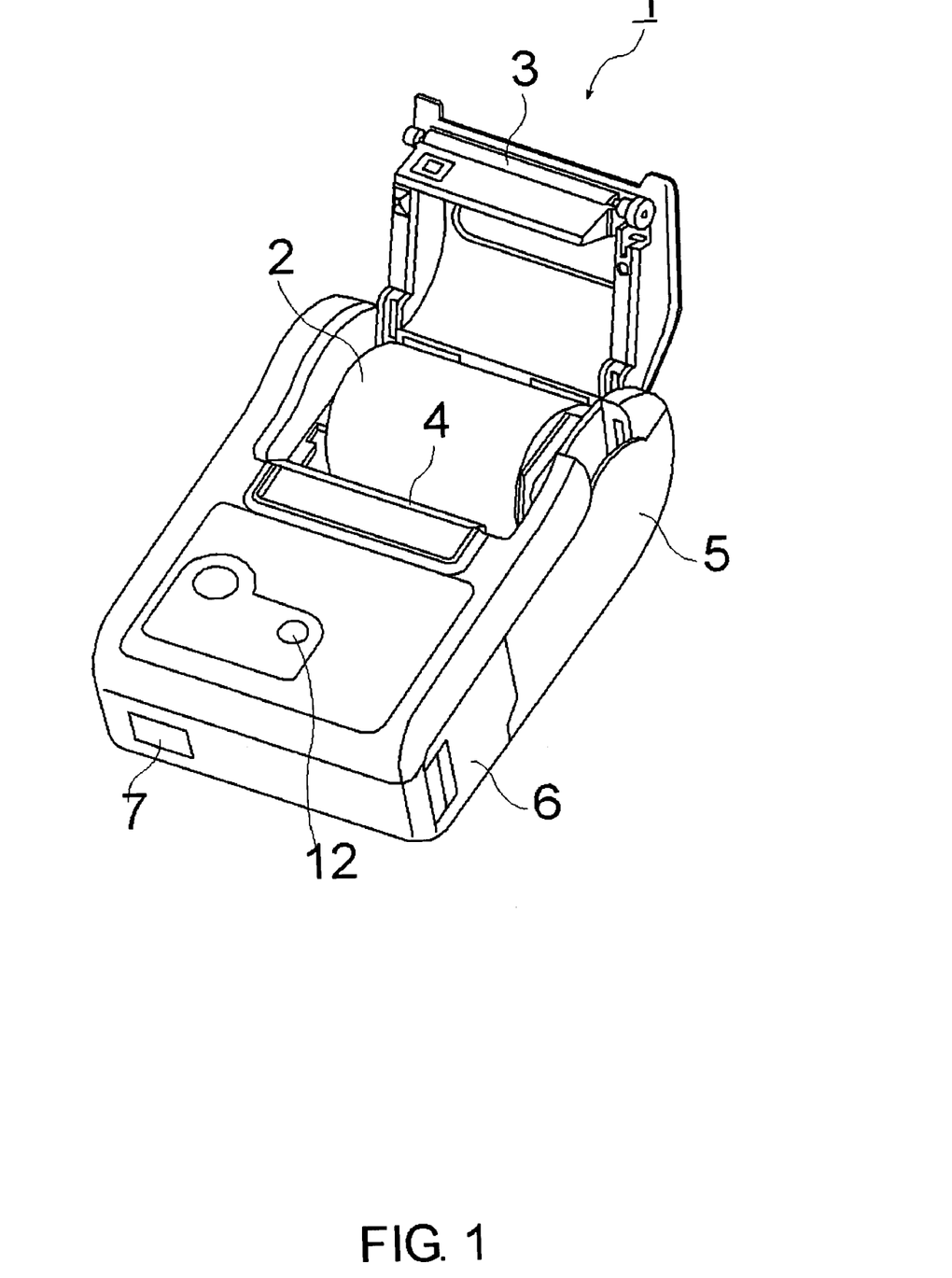
FIG. 1 is an oblique view showing a compact printer according to a preferred embodiment of the present invention.

FIG. 1 shows a mobile compact printer 1 according to an embodiment of this invention. Roll paper 2 is loaded inside the compact printer 1. The roll paper 2 is withdrawn from the roll and advanced by a transportation roller 3, and is printed by a thermal print head 4. A power paper cutter (not shown) is also assembled inside the case 5. The power paper cutter cuts the free end of the roll paper at a specific position. A lithium battery (not shown) is loaded inside a battery compartment behind a battery cover 6. The remaining battery capacity is indicated on a display 7. When the user presses a paper feed switch 12, the transportation roller 3 turns and conveys the roll paper 2.

Figure 2:
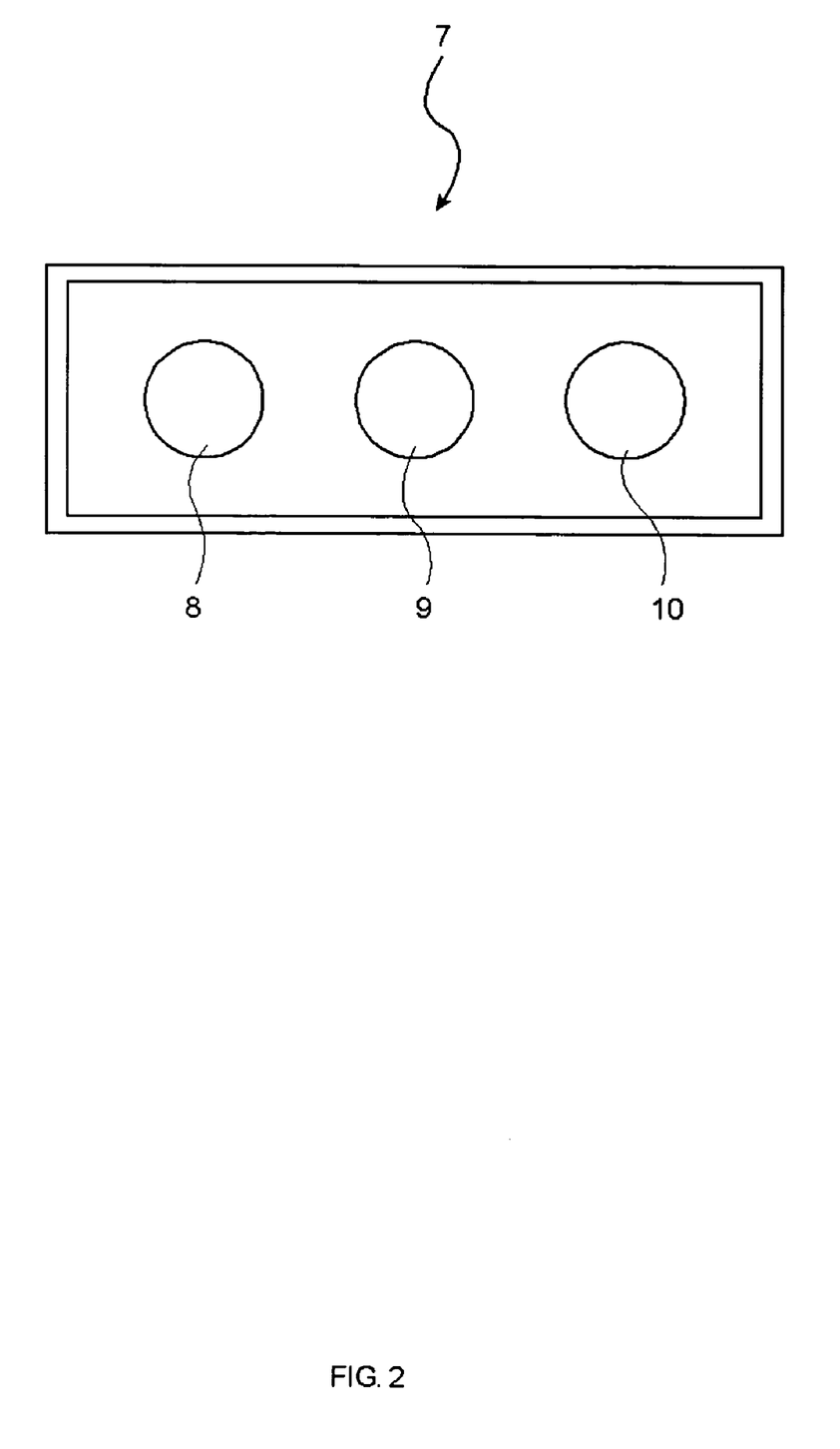
FIG. 2 is a plan view showing the display in the compact printer of this embodiment.

The display 7 in this embodiment is a series of three LEDs 7a, 7b, 7c as shown in FIG. 2. Battery capacity is indicated and the printer status is known by controlling the flashing of these LEDs 7a, 7b, 7c. Table 1 shows the relationship between the remaining battery capacity and the printer status.

TABLE 1

| Battery Capacity Range | Remaining battery capacity (normal temperature) | Printer status |
|---|---|---|
| H | Battery capacity approx. 100%–70% | Printer can operate |
| M | Battery capacity approx. 70%–30% | Printer can operate |
| L | Battery capacity less than 30%; charging needed. Printer operation possible. | Printer is operable, but battery must be replaced or charged soon. |
| S | Substantially no battery capacity left; printer inoperable. | Printer inoperable |
| F | Near depletion level; printer power shut off in hardware. (shutdown voltage) | Main power supply shut off |

Figure 3:
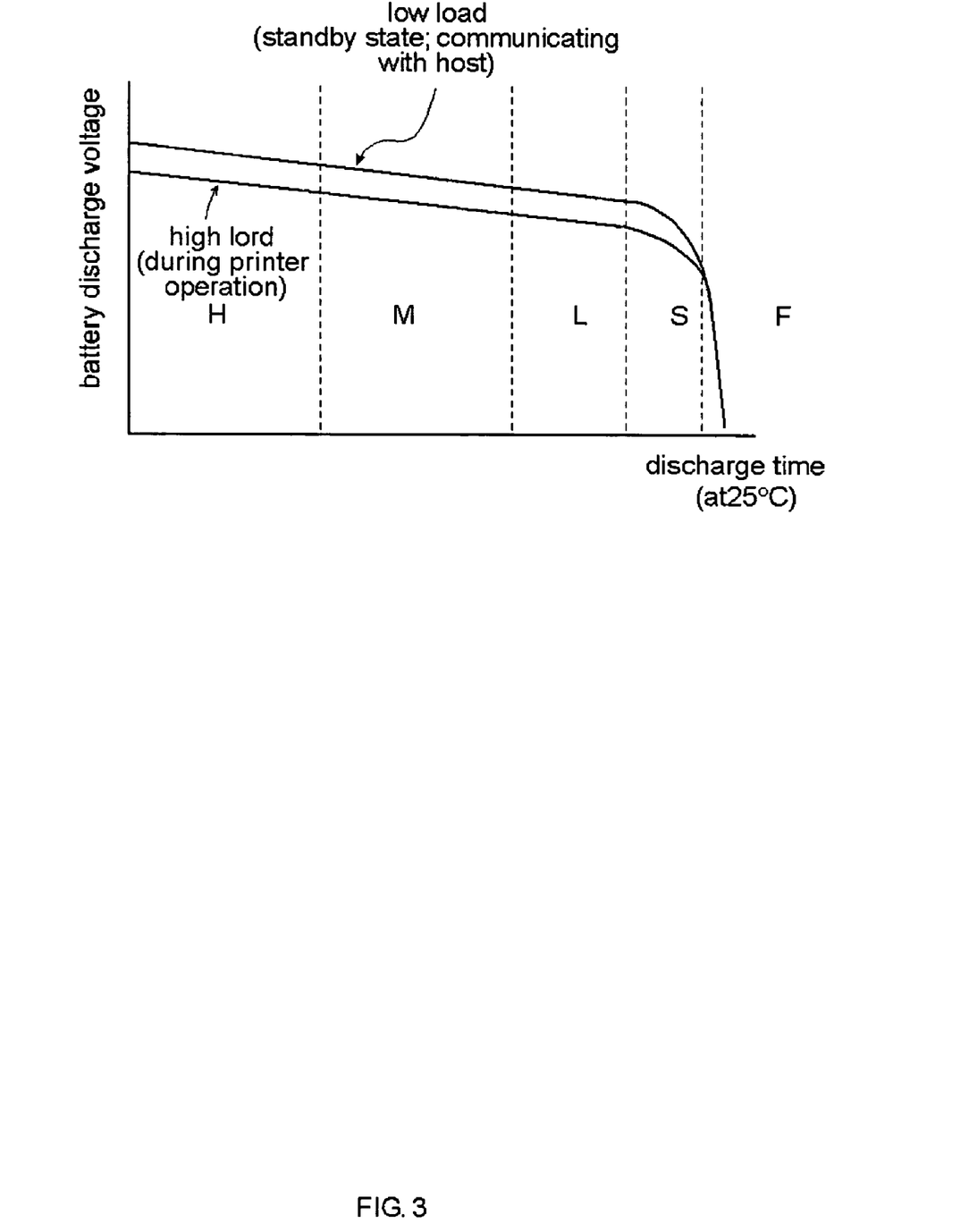
FIG. 3 is a graph showing the relationship between battery discharge voltage and remaining battery capacity levels.

FIG. 3 is a graph showing the relationship between the battery discharge voltage and the remaining battery capacity (in ranges H, M, L, S, F as described in Table 1). The battery discharge voltage differs according to the operating mode (high load mode and low load mode). Operation of the display 7, according to the battery capacity level, is shown in Table 2.

TABLE 2

| Battery level | LED 7a | LED 7b | LED 7c |
|---|---|---|---|
| H | ON | ON | ON |
| M | ON | ON | |
| L | ON | | |
| S | FLASHING | | |
| F | | | |

Note:
Blank table cells indicate the LED is off.

The method of indicating the remaining battery capacity is not limited to the display 7 described above, and a liquid crystal display or various other types of displays could be used.

Figure 4:
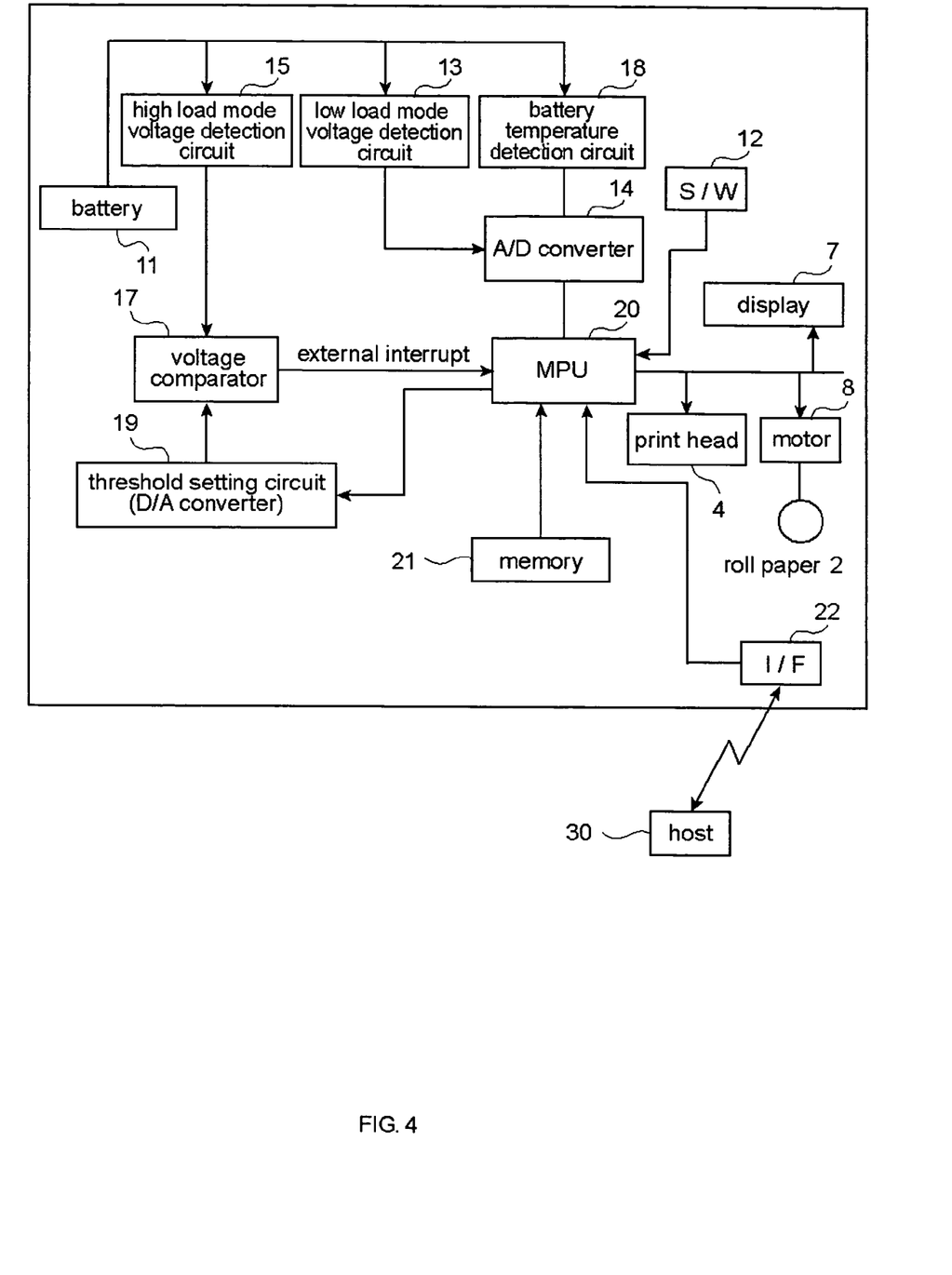
FIG. 4 is a function block diagram describing operation of the compact printer of this embodiment.
Figure 5:
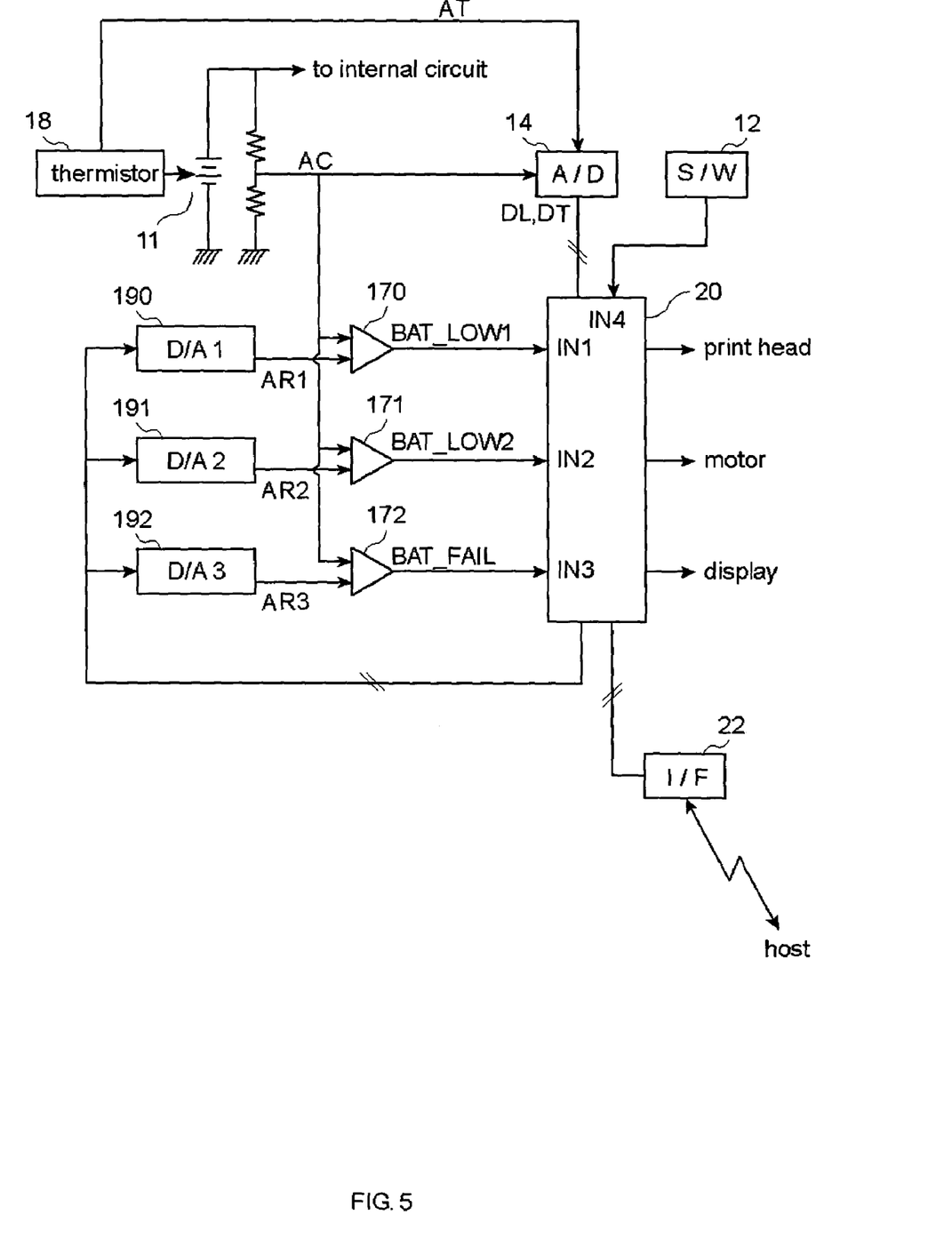
FIG. 5 shows the main circuit configuration of the present embodiment.

FIG. 4 is a function block diagram illustrating the operation of a printer 1 according to this embodiment of the invention. FIG. 5 shows the essential circuit configuration.

As shown in FIG. 4, the discharge voltage of battery 11 is applied to low load mode (voltage) detection circuit 13 and high load mode (voltage) detection circuit 15. The analog discharge voltage detected by the low load mode detection circuit 13 is converted to a digital signal or value by an A/D converter 14, and then applied to the MPU 20, the control device. More specifically, as shown in FIG. 5, the analog voltage $A_C$ of the approximately ¼ of the discharge voltage of the battery 11 as obtained by a voltage divider is applied to the A/D converter 14 and converted to digital signal value $D_L$.

The analog signal $A_T$ of the temperature of the battery 11 as detected by a thermistor 18 is applied as an input to the A/D converter 14 and converted to a digital signal $D_T$. The resolution of the A/D converter in this embodiment is 10 bits. $D_L$ and $D_T$ are numerical values that represent analog voltage or temperature respectively. Therefore, these values are set forth without unit designation.

Print commands and print data sent from a host 30 are received at an interface 22 of the printer 1. The MPU 20 interprets the received print commands, then heats the thermal print head 4 and controls a motor 8. As a result, the received print data is printed on roll paper 2. When a device with high power consumption such as the thermal print head 4 or the motor 8 is driven in response to a received print command, the MPU 20 changes the operating mode from the low load mode to the high load mode. Conversely, when elements with such high power consumption are not driven, the MPU 20 sets the operating mode to the low load mode.

The output of paper feed switch 12 is connected to interrupt port IN4 of MPU 20. Pressing the paper feed switch 12 therefore starts a paper feed interrupt process, and the motor 8 is driven. As a result, receiving a print command and pressing the paper feed switch 12 are both triggers for changing the operating mode from the low load mode to the high load mode.

Furthermore, since the printer 1 of this embodiment has a power paper cutter, receiving a paper cutting command from the host 30 and pressing a paper cutting switch on the printer 1 are also triggers for changing the operating mode from the low load mode to the high load mode.

Because the motor and/or heater operate when feeding paper, the thermal head is being heated, printing is performed and paper is being cut with the power paper cutter, the high load mode can be set when the motor and/or heater turns on, and the low load mode can be set when they are turned off. It is therefore possible to know the operating mode based on the on or off status of mechanical or thermal operating elements.

When the printer 1 is operating in the low load mode, the MPU 20 samples the digital signals $D_L$ and $D_T$ from the A/D converter 14, and ignores signals from the voltage comparator 17.

Rewritable memory 21 stores data tables defining the remaining battery capacity in the low load mode. An example of this data table is shown in Table 3.

TABLE 3

| Battery temperature (° C.) | $D_T$ | Range H | Range M | Range L | S |
|---|---|---|---|---|---|
| <= −20 | >=712 | Error | Error | Error | Error |
| −19 to −15 | 711 to 656 | >7.1 | 7.1 to 6.8 | 6.8 to 6.5 | <=6.5 |
| −14 to −10 | 655 to 600 | >7.1 | 7.1 to 6.8 | 6.8 to 6.5 | <=6.5 |
| −9 to −5 | 599 to 543 | >7.3 | 7.3 to 6.9 | 6.9 to 6.6 | <=6.6 |
| −4 to 0 | 542 to 487 | >7.5 | 7.5 to 7.2 | 7.2 to 6.9 | <=6.9 |
| 1 to 5 | 486 to 433 | >7.6 | 7.6 to 7.2 | 7.2 to 6.9 | <=6.9 |
| 6 to 10 | 432 to 383 | >7.7 | 7.7 to 7.2 | 7.2 to 7.0 | <=7.0 |
| 11 to 15 | 382 to 336 | >7.8 | 7.8 to 7.3 | 7.3 to 7.0 | <=7.0 |
| 16 to 20 | 335 to 293 | >7.8 | 7.8 to 7.3 | 7.3 to 7.0 | <=7.0 |
| 21 to 25 | 292 to 256 | >7.8 | 7.8 to 7.3 | 7.3 to 7.0 | <=7.0 |
| 26 to 30 | 255 to 222 | >7.8 | 7.8 to 7.3 | 7.3 to 7.0 | <=7.0 |
| 31 to 35 | 221 to 192 | >7.8 | 7.8 to 7.3 | 7.3 to 7.0 | <=7.0 |
| 36 to 40 | 191 to 166 | >7.8 | 7.8 to 7.3 | 7.3 to 7.0 | <=7.0 |
| 41 to 45 | 165 to 144 | >7.8 | 7.8 to 7.3 | 7.3 to 7.0 | <=7.0 |
| 46 to 50 | 143 to 124 | >7.8 | 7.8 to 7.3 | 7.3 to 7.0 | <=7.0 |
| 51 to 55 | 123 to 107 | >7.8 | 7.8 to 7.3 | 7.3 to 7.0 | <=7.0 |
| 56 to 60 | 106 to 93 | >7.8 | 7.8 to 7.3 | 7.3 to 7.0 | <=7.0 |
| 61 to 65 | 92 to 81 | >7.8 | 7.8 to 7.3 | 7.3 to 7.0 | <=7.0 |
| 66 to 70 | 80 to 70 | >7.8 | 7.8 to 7.3 | 7.3 to 7.0 | <=7.0 |
| >=71 | <=69 | Error | Error | Error | Error |

Referring to Table 3, $D_T$ is defined to have a value in the range 382 to 336 when the battery temperature is 11° C. to 15° C. If at this $D_T$ the value of $D_L$ that represents the battery discharge voltage exceeds a value of 7.8, the remaining battery capacity range is determined to be H. If $D_L$ is less than or equal to 7.8 and is greater than 7.3, is less than or equal to 7.3 and is greater than 7.0, or is less than or equal to 7.0, the battery capacity level is determined to be in the range M, L, and S, respectively. These battery capacity levels are described in Table 1, and the display state of the display 7 at each level is shown in Table 2.

When the printer 1 is in the high load mode, the MPU 20 ignores the digital value signals $D_L$ and $D_T$ from the A/D converter 14 and recognizes the interrupt signal from the voltage comparator 17.

The voltage comparator 17 could be three parallel comparators 170, 171, 172 as shown in FIG. 5. Battery capacity can be detected with high precision by thus using multiple comparators in parallel. The D/A converters 190, 191, 192 of the threshold setting circuit 19 are respectively connected to one input terminal of comparators 170, 171, 172.

The analog battery 11 voltage discharge signal $A_C$ is applied to the other input terminal of the comparators 170, 171, 172.

When analog voltage $A_C$ is lower than the threshold voltage (comparison voltage signal $A_{R1}$) from D/A converter 190, comparator 170 generates pulse signal BAT_LOW1.

When analog voltage $A_C$ is lower than the threshold voltage (comparison voltage signal $A_{R2}$) from D/A converter 191, comparator 171 generates pulse signal BAT_LOW2.

Likewise, when analog voltage $A_C$ is lower than the threshold voltage (comparison voltage signal $A_{R3}$) from D/A converter 192, comparator 172 generates pulse signal BAT_FAIL.

These pulse signals BAT_LOW1, BAT_LOW2, and BAT_FAIL are applied respectively to interrupt ports IN1, IN2, and IN3 of the MPU 20.

Processing by the MPU 20 (the operating method of the operator) based on these pulse signals is shown in Table 4. The MPU 20 sets the remaining battery capacity levels based on this table.

TABLE 4

| Signal | Interrupt detection | Priority | Port | Description |
|---|---|---|---|---|
| BAT_LOW1 | rising edge | 3 (low) | IN1 | Battery level = M if interrupt asserted 3 times |
| BAT_LOW2 | rising edge | 2 (med) | IN2 | Battery level = L if interrupt asserted 3 times |
| BAT_FAIL | rising edge | 1 (high) | IN3 | Battery level = S if interrupt asserted 3 times |

* If multiple interrupts are asserted simultaneously, the highest priority interrupt is used.

Table 5 is an example of a data table for setting the threshold voltage of the D/A converters 190, 191, 192 relative to the temperature of battery 11. Based on the temperature of the battery 11 detected just before the operating mode switches from the low load mode to the high load mode, the MPU 20 sets the threshold values of the D/A converters 190, 191, 192 to the values derived from Table 5. The temperature of the battery 11 is constantly monitored in the low load mode. The D/A converters 190, 191, 192 output comparison voltage signals $A_{R1}, A_{R2}, A_{R3}$ synchronized to a specific timing.

TABLE 5

| Battery temperature (° C.) | $D_T$ | D/A 1 threshold | D/A 2 threshold | D/A 3 threshold |
|---|---|---|---|---|
| <=−20 | >=712 | Error | Error | Error |
| −19 to −15 | 711 to 656 | 6.4 | 6.2 | 5.9 |
| −14 to −10 | 655 to 600 | 6.4 | 6.2 | 5.9 |
| −9 to −5 | 599 to 543 | 6.5 | 6.3 | 6.0 |
| −4 to 0 | 542 to 487 | 6.8 | 6.4 | 6.1 |
| 1 to 5 | 486 to 433 | 6.9 | 6.5 | 6.2 |
| 6 to 10 | 432 to 383 | 7.1 | 6.6 | 6.3 |
| 11 to 15 | 382 to 336 | 7.2 | 6.7 | 6.4 |
| 16 to 20 | 335 to 293 | 7.3 | 6.9 | 6.5 |
| 21 to 25 | 292 to 256 | 7.3 | 6.9 | 6.5 |
| 26 to 30 | 255 to 222 | 7.3 | 6.9 | 6.5 |
| 31 to 35 | 221 to 192 | 7.3 | 6.9 | 6.5 |
| 36 to 40 | 191 to 166 | 7.3 | 6.9 | 6.5 |
| 41 to 45 | 165 to 144 | 7.3 | 6.9 | 6.5 |
| 46 to 50 | 143 to 124 | 7.3 | 6.9 | 6.5 |
| 51 to 55 | 123 to 107 | 7.3 | 6.9 | 6.5 |
| 56 to 60 | 106 to 93 | 7.3 | 6.9 | 6.5 |
| 61 to 65 | 92 to 81 | 7.3 | 6.9 | 6.5 |
| 66 to 70 | 80 to 70 | 7.3 | 6.9 | 6.5 |
| >=71 | <=69 | 7.3 | 6.9 | 6.5 |

When the operating mode changes from the low load mode to the high load mode (such as when the motor 8 is driven by a print command), the battery 11 temperature detected just before the mode change is stored, i.e., $D_T$ is stored and the threshold values of the D/A converters 190, 191, 192 are determined based on the battery temperature. For example, if the battery temperature is 11° C. to 15° C., the threshold values of D/A converters 190, 191, 192 are respectively set to 7.2, 6.7, and 6.4.

If the value of $D_T$ is 7.0, only pulse signal BAT_LOW1 is output from D/A converter 190. When this pulse signal is asserted three times, MPU 20 determines the battery capacity to be in the range M, and drives the display 7 according to Table 2 to indicate the remaining battery capacity.

If the value of $D_T$ is 6.5, pulse signals BAT_LOW1 and BAT_LOW2 are output from D/A converter 190 and D/A converter 191. Because the latter pulse signal BAT_LOW2 has higher priority, MPU 20 determines the battery capacity to be in range L (see Table 4), and drives the display 7 according to Table 2 to indicate the remaining battery capacity.

After the high load mode ends such as after printing ends and the low load mode has stabilized (after approximately 10 seconds, for example), battery capacity detection in the low load mode is resumed.

The program for controlling the processor of MPU 20 is stored in ROM in the MPU in this implementation of the invention, and the data tables shown in Table 3 and Table 5 are also stored in rewritable memory 21. This arrangement makes it easy to change the data tables when battery characteristics change, for example.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A battery capacity detection apparatus for detecting the remaining capacity in a battery installed in a device capable of operating in either a high load mode or a low load mode, comprising:

a microprocessor for determining if the device is in the low load mode or in the high load mode of operation;

an operating mode detection circuit for detecting the analog discharge voltage of the battery;

an A/D converter for converting the detected analog discharge voltage of said battery into a digital output signal; and a comparator for comparing the detected analog discharge voltage of said battery with a specific reference voltage;

wherein when said microprocessor determines that the operating mode of the device is the low load mode said microprocessor calculates the battery capacity remaining in said battery directly from said digital output signal from the A/D converter and wherein when said microprocessor determines that the operating mode of the device is in the high load mode said microprocessor calculates the battery capacity remaining in said battery from an output of said comparator based upon an interrupt process of the microprocessor.

2. A battery capacity detection apparatus as described in claim 1, further comprising a thermistor for measuring battery temperature and for providing a thermistor output corresponding to the measured temperature, with said microprocessor calculation of the remaining battery capacity dependent upon said thermistor output.

3. A battery capacity detection apparatus as described in claim 1 wherein said microprocessor determines the operating mode of the device based on the on/off status of a predetermined mechanical or thermal operating part of the device.

4. A battery capacity detection apparatus as described in claim 2 wherein said microprocessor determines the operating mode of the device based on the on/off status of a predetermined mechanical or thermal operating part of the device.

5. A battery capacity detection apparatus as described in claim 1 wherein the comparator is a parallel arrangement of multiple comparators with each comparator providing a given output signal when the comparison voltage from such comparator is lower than a given threshold voltage corresponding to different levels of remaining capacity in said battery during the high load mode of operation.

6. A battery capacity detection apparatus for detecting remaining capacity in a battery installed in a device capable of operating in either a high load mode or a low load mode, comprising:

circuit means for determining if the device is operating in a low load mode or a high load mode;

an A/D converter for converting the analog discharge voltage of the battery to a digital value;

a comparator for comparing the battery analog discharge voltage with a specific threshold reference; and wherein when said circuit means determines that the operating mode of the device is the low load mode, the circuit means calculates remaining battery capacity according to a program directly from the digital output value from the A/D converter and calculating the remaining battery capacity from an output of the comparator when the circuit means determines that the operating mode of the device is in the high load mode based upon an interrupt process.

7. A battery capacity detection method for detecting remaining capacity in a battery installed in a device capable of operating in either a high load mode or a low load mode, comprising steps of:

determining if the device is operating in the low load mode or in the high load mode;

converting the analog discharge voltage of the battery into a digital output signal;

comparing the battery analog discharge voltage with a specific threshold reference to generate a comparator output and using a microprocessor for calculating the capacity remaining in the battery directly from the digital output signal only when the device is operating in the low load mode; and for calculating the capacity remaining in the battery from said comparator output based upon an interrupt process of the microprocessor only when the device is operating in the high load mode.

8. A battery capacity detection method as described in claim 7, wherein battery temperature is measured and the measured temperature is referenced by said microprocessor to calculate remaining battery capacity.

9. A battery capacity detection method for detecting remaining capacity in a battery installed in a device, comprising:

an operating mode detection step for determining if the device is operating in a low load mode or a high load mode;

an A/D conversion step for converting an analog battery output to a digital value;

a comparison step for comparing battery output with a specific reference output; and a calculation step for calculating remaining battery capacity directly from the digital output from the A/D conversion step when the operating mode detection step determines the device is operating in the low load mode, and for calculating remaining battery capacity based on the comparison step using a microprocessor to perform the calculation step when the operating mode detection step determines the device is operating in the high load mode.

* * * * *